United States Patent
Nam (10) Patent No.: US 6,963,083 B2
(45) Date of Patent: Nov. 8, 2005

(54) LIQUID CRYSTAL DISPLAY DEVICE HAVING POLYCRYSTALLINE TFT AND FABRICATING METHOD THEREOF

(75) Inventor: Dae Hyun Nam, Kyunggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/663,765

(22) Filed: Sep. 17, 2003

(65) Prior Publication Data
US 2004/0262610 A1 Dec. 30, 2004

(30) Foreign Application Priority Data
Jun. 30, 2003 (KR) .................... 10-2003-0043989

(51) Int. Cl.⁷ .................. H01L 29/04; H01L 31/20; H01L 31/36; H01L 31/376; H01L 29/76; H01L 31/62; H01L 31/113

(52) U.S. Cl. .................. 257/59; 257/72; 257/382

(58) Field of Search .................. 257/59, 72, 350, 257/351, 382–412

(56) References Cited

U.S. PATENT DOCUMENTS

| | | | |
|---|---|---|---|
| 6,420,758 B1 * | 7/2002 | Nakajima | 257/72 |
| 6,512,271 B1 * | 1/2003 | Yamazaki et al. | 257/59 |
| 6,559,906 B1 * | 5/2003 | Kawachi et al. | 257/59 |

OTHER PUBLICATIONS

Philips Electronics Document entitled "Device Architectures" 2001, pp. 14-21.

\* cited by examiner

*Primary Examiner*—Cuong Nguyen
(74) *Attorney, Agent, or Firm*—Morgan, Lewis & Bockius LLP (57) ABSTRACT

A thin film transistor includes a substrate, a crystallized semiconductor layer formed over the substrate having a channel region, low-density impurity regions and high-density impurity regions, a gate insulating layer formed on the crystallized semiconductor layer, a first gate electrode formed on the gate insulating layer having a width corresponding to the channel region, a second gate electrode formed on the first gate electrode and on the gate insulating layer such that the second gate electrode overlaps the low-density impurity regions and a source electrode and a drain electrode respectively contacting the high-density impurity regions.

21 Claims, 11 Drawing Sheets

LIQUID CRYSTAL DISPLAY DEVICE HAVING POLYCRYSTALLINE TFT AND FABRICATING METHOD THEREOF

The present invention claims the benefit of Korean Patent Application No. 2003-43989 filed in Korea on Jun. 30, 2003, which is hereby incorporated by reference

BACKGROUND OF THE INVENTION

1. Field of the Invention

The present invention relates to a liquid crystal display device and a fabricating method thereof, more particularly to a liquid crystal display device having a GOLDD (gate overlapped lightly doped drain) type polycrystalline TFT and a fabricating method thereof.

2. Description of the Prior Art

Recently, light-weighted and small-sized flat panel display devices have been actively developed. Among flat panel display devices, the liquid crystal display device has been mass-produced and widely used. One type of liquid crystal display device is a transmission type liquid crystal display device having a TFT (thin film transistor) that is used as a switching device to operate each pixel independently.

In general, a liquid crystal display device includes: a pixel area having plurality of pixels to realize an image; and a driving circuit area for applying various signals to the pixel area. TFTs are formed in both the pixel area and in the driving circuit area. A TFT includes a semiconductor layer forming a channel in which a current flows, a gate electrode for developing an electric field for turning on/off the current flow in the channel according to an applied signal, and a source electrode and a drain electrode for transmitting a data signal to a pixel in accordance with an applied input signal to the gate electrode. As a result of the development of a COG (chip on glass), TFTs have been used to make a more compact liquid crystal display device by forming a polycrystalline TFTs having high field effect mobility in the driving circuit area. The need for high field effect mobility is much greater for the TFTs formed in the driving circuit area than for the TFTs formed in the pixel area. Thus, polycrystalline TFTs are typically formed in the driving circuit area.

Due to the desire for even lighter-weight and smaller-size display devices, there is still a need to reduce the size of a liquid crystal display device. However, it is impossible to reduce the size of the pixel area in which an image is displayed since the size thereof is set to display a desired image size. Therefore, the driving circuit area has to be where a reduction in size takes place. However, when the driving circuit area is reduced, the size of the TFT in the driving circuit area inevitably has to be reduced. A reduction in the size of the TFT means reduction of channel length. The reduction of channel length may cause damage to the channel region due to hot carriers passing through the channel. In addition, the threshold voltage of the TFT may be changed due to hot carriers. A change in the threshold voltage will degrade the quality of a displayed image.

To solve the hot carrier problems, an LDD (lightly doped drain) type TFT is used. The LDD type TFT is fabricated by forming low-density impurity regions adjacent to the channel region and forming a high-density impurity regions separated from the channel region by the low-density impurity regions. In addition, the LDD type TFT prevents leakage current from occurring through the TFT. Because the leakage current or off current of the LDD type TFT is less than that of a general TFT, an LDD type TFT controls signals more efficiently to render a higher quality picture.

Even in an LDD type TFT, there is a limit to how much the channel length can be reduced. The LDD type TFT may not be easily reproducible such that an entire array of TFTs will consistently have the same hot carrier resistance if the channel length gets too short. Over time, the reliability of LDD type TFTs can degrade, especially when the channels are very short. Accordingly, when a TFT is used for a display device having high picture quality and high resolution, such as a HDTV, channel damage may occur due to hot carriers.

To solve the problem of consistency and reliability, a GOLDD (gate overlapped LDD) type TFT has been developed. In the GOLDD type TFT, the gate electrode overlaps the LDD regions or low-density impurity regions of the TFT. Thus, a short channel TFT can be constructed with a high hot carrier resistance such that an array of small-sized TFTs having high reliability can be fabricated.

Figure 1A:
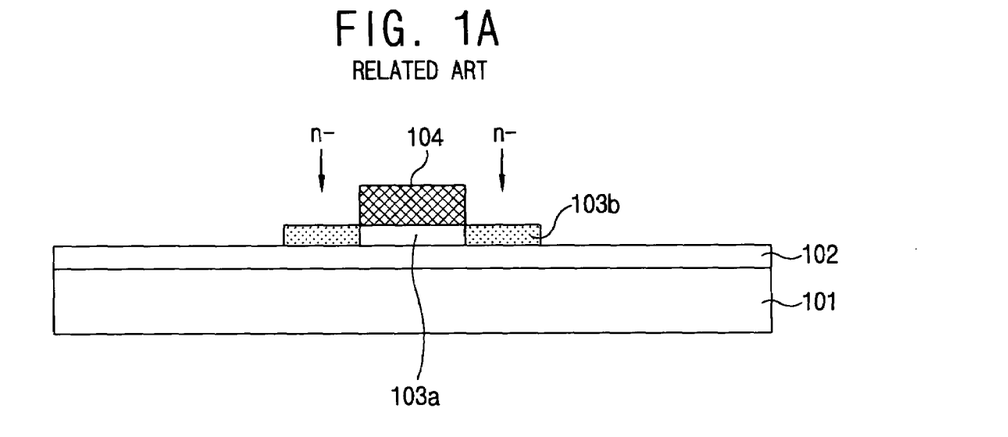
FIGS. 1A to 1F illustrate fabrication processes of a related art GOLDD type liquid crystal display device.

Hereinafter, processes for fabricating a related art GOLDD type TFT will be described with reference to FIGS. 1A to 1F. First, as shown in FIG. 1A, after forming a buffer layer 102 on a substrate 101 made of a transparent substance, such as glass, a semiconductor layer 103 is formed by laminating amorphous semiconductor, such as silicon, on the buffer layer 102 and etching the amorphous semiconductor. After blocking a region of the semiconductor layer to be a channel region 103a using a photoresist pattern formed on the semiconductor layer, lightly doped source and drain regions 103b are respectively formed by introducing low-density impurities, such as n− type ions, into regions of the semiconductor layer that are not blocked by the photoresist pattern.

Figure 1B:
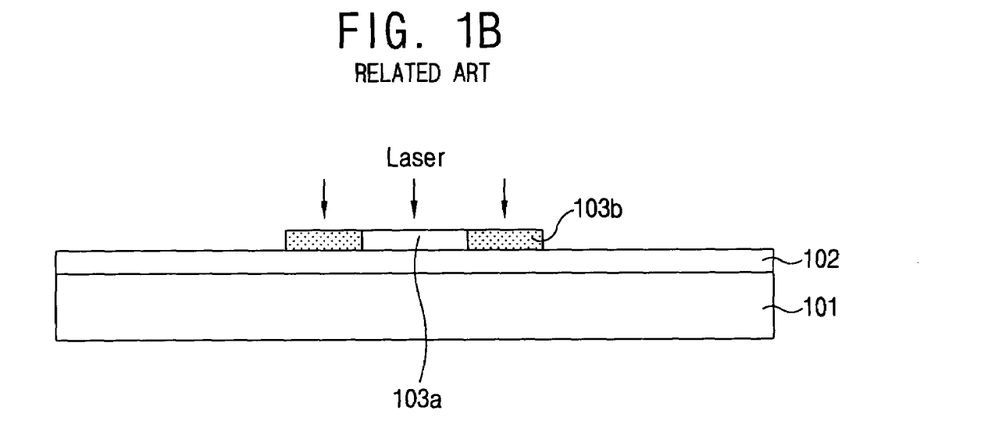
Figure 1C:
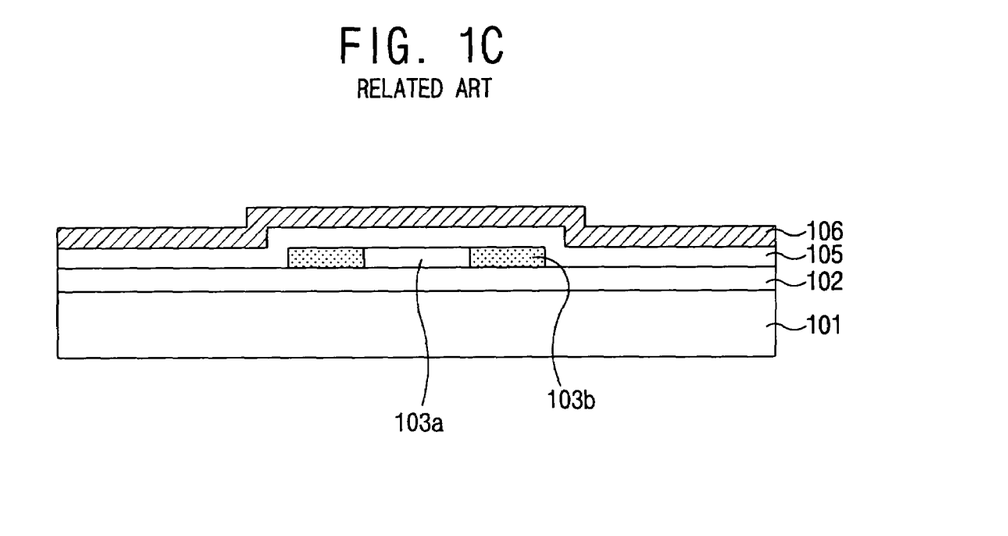

As shown in FIG. 1B, after removing the photoresist 104 over the channel region 103a, the amorphous semiconductor layer is crystallized by laser irradiation of the semiconductor layer, and the injected impurity ions are simultaneously activated. As shown in FIG. 1C, a gate insulating layer 105 is formed on the channel region 103a and the lightly doped source and drain regions 103b. A metal layer 106 is then formed on the gate insulating layer 105.

Figure 1D:
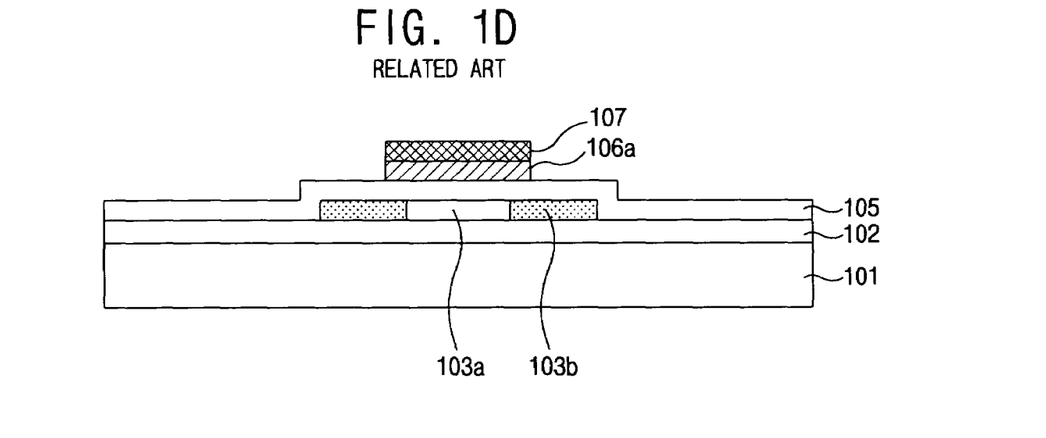
Figure 1E:
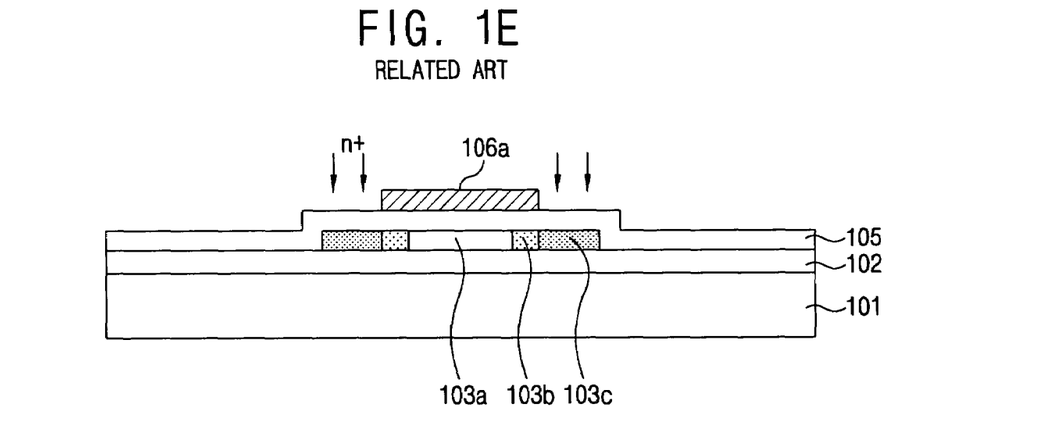

As shown in FIG. 1D, a photoresist is then deposited on the metal layer 106 and patterned by a photolithography process to form a photoresist pattern 107. A gate electrode 106a is formed by etching the metal layer 106 using the photoresist pattern 107 as a mask. The gate electrode 106a is formed to overlap the lightly doped source and drain regions 103b. Next, as shown in FIG. 1E, high-density impurity ions, such as n+ type ions, are injected into the lightly doped source and regions 103b using the gate electrode 106a as a mask. After the high-density impurity ion injection, the outer parts of the lightly doped source and drain regions 103b, which were not blocked by the gate electrode 106a, become highly doped source and drain regions 103c. Accordingly, the gate electrode 106a overlaps the lightly doped source and drain regions that are otherwise known as LDD regions.

Figure 1F:
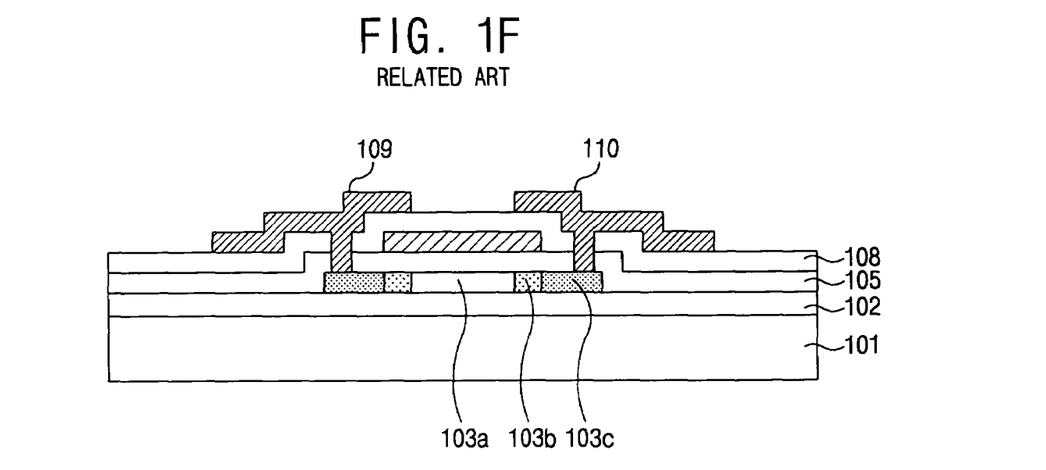

After forming the high-density impurity regions or highly doped source and drain regions 103c, as shown in FIG. 1F, a passivation layer 108 is formed over the whole substrate 101. Furthermore, a metal layer is deposited over the passivation layer 108 and etched to form a source electrode 109 and a drain electrode 110. The source electrode 109 and the drain electrode 110 respectively contact the highly doped source and drain regions 103c through contact holes in the passivation layer 108 and in the gate insulating layer 105.

As described-above, two masks are respectively used to inject low-density impurity ions and high-density impurity ions for forming of the GOLDD type TFT. More specifically, a first mask is used to form a photoresist pattern on the semiconductor layer, which is used to inject low-density impurity ions into the semiconductor layer. A second mask is used to form a gate electrode. The gate electrode is then used to block portions of the semiconductor layer already having low-density impurity ions during an injection of high-density impurity ions into other portions of the semiconductor layer in which low-density impurity ions are also already injected. Masks used in photolithography processes are expensive. Accordingly, fabricating costs are expensive when using the two masks of the related art for forming the related art GOLDD type TFT.

SUMMARY OF THE INVENTION

Accordingly, the present invention is directed to a liquid crystal display device having a GOLDD (gate overlapped lightly doped drain) type polycrystalline TFT and a fabricating method thereof that substantially obviate one or more of the problems due to limitations and disadvantages of the related art.

An object of the present invention is to provide a TFT and a fabrication method thereof capable of simplifying fabrication processes and reducing fabrication costs.

Another object of the present invention to provide a liquid crystal display device and a fabrication method thereof capable of implementing a SOP (system on panel) using a GOLDD type TFT.

Additional features and advantages of the invention will be set forth in the description, which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described a TFT in accordance with an embodiment of the present invention includes: a substrate; a crystallized semiconductor layer formed over the substrate having a channel region, low-density impurity regions and high-density impurity regions; a gate insulating layer formed on the crystallized semiconductor layer, a first gate electrode formed on the gate insulating layer having a width corresponding to the channel region; a second gate electrode formed on the first gate electrode and on the gate insulating layer such that the second gate electrode overlaps the low-density impurity regions; and a source electrode and a drain electrode respectively contacting the high-density impurity regions.

In another aspect, a liquid crystal display device includes: a first substrate and a second substrate; a plurality of gate lines and data lines formed over the first substrate so as to define a plurality of pixels; thin film transistors arranged in the plurality of pixels that each include a polycrystalline semiconductor layer including a channel region between low-density impurity regions that are in between high-density impurity regions, a gate insulating layer formed on the polycrystalline semiconductor layer, a first gate electrode formed on the gate insulating layer corresponding to the channel region, a second gate electrode formed on the first gate electrode and on the gate insulating layer such that the second gate electrode overlaps the low-density impurity regions, and a source electrode and a drain electrode contacted to the high-density impurity regions; a pixel electrode formed in the pixel area; a color filter layer formed on the second substrate; and a liquid crystal layer formed between the first substrate and the second substrate.

In another aspect, a liquid crystal display device includes: a first substrate including a pixel area and a driving circuit area; a first thin film transistor formed in the pixel area; a second thin film transistor formed in the driving circuit area, the second thin film transistor including two layers of gate electrodes, a semiconductor layer having a low-density impurity regions overlapped with only one of the gate electrode layers, a source electrode and a drain electrode; and a third thin film transistor formed in the driving circuit area.

In another aspect, a method for fabricating a thin film transistor includes: providing a substrate; forming a polycrystalline semiconductor layer over the substrate; forming a gate insulating on the polycrystalline semiconductor layer; forming a first gate electrode on the gate insulating layer using a mask; forming a low-density impurity regions by introducing low-density impurities into the polycrystalline semiconductor layer after blocking the polycrystalline semiconductor layer with the first gate electrode; forming a second gate electrode having a width greater than that of the first gate electrode; forming a high-density impurity regions by introducing high-density impurities into portions of the low-density impurity regions after blocking parts of the low-density impurity regions with the second gate electrode; and forming a source electrode and a drain electrode respectively contacted to the high-density impurity regions.

In another aspect, a method for fabricating a thin film transistor includes: providing a substrate over which a polycrystalline semiconductor layer is formed; forming a gate insulating layer on the polycrystalline semiconductor layer; forming a first gate electrode on the gate insulating layer; introducing low-density impurities into the semiconductor layer using the first gate electrode as a mask; forming a second gate electrode having a width greater than that of the first gate electrode; introducing high-density impurities into the semiconductor layer using the second gate electrode as a mask; and forming a source electrode and a drain electrode.

In another aspect, a method for fabricating a liquid crystal device including: providing a first substrate and a second substrate; forming a polycrystalline semiconductor layer over the first substrate; forming a gate insulating layer on the polycrystalline semiconductor layer; forming a first gate electrode on the gate insulating layer using a mask; forming low-density impurity regions by introducing low-density impurities into the polycrystalline semiconductor layer after blocking the polycrystalline semiconductor layer with the first gate electrode; forming a second gate electrode having a width greater than that of the first gate electrode using the mask; forming a high-density impurity regions by introducing high-density impurities into portions of the low-density impurity regions after blocking parts of the low-density impurity regions with the second gate electrode; forming a source electrode and a drain electrode respectively contacted to the high-density impurity regions; forming a passivation layer over the whole surface of the first substrate; forming a pixel electrode on the passivation layer; forming a color filter layer on the second substrate; and forming a liquid crystal layer between the first and second substrates.

In another aspect, a method of fabricating a liquid crystal display panel including: providing a first substrate divided into a pixel area and a driving circuit area; forming a first thin film transistor in the driving circuit area having a first semiconductor layer, wherein the first thin film transistor has two layers of gate electrodes in which only one of the layers overlaps low-density impurity regions in the first semiconductor layer; forming a second thin film transistor in the driving circuit area; and forming a third thin film transistor in the pixel area.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of a GOLDD type TFT in accordance with the present invention will be described. In exemplary embodiments of the present invention, only one mask is used in forming the low-density impurity regions and high-density impurity regions of a GOLDD type TFT. Two gate electrodes having different widths are sequentially formed. Each of the gate electrodes is used for blocking portions of a semiconducting layer during an injection of ions into other portions of the semiconductor layer. In more detail, the two gate electrodes respectively block a semiconductor layer to inject low-density impurity ions and high-density impurity ions into the semiconductor layer to thereby respectively form low-density impurity regions and high-density impurity regions. By over-etching a metal layer or ashing a photoresist pattern, the first gate electrode has a narrower width than a second sequentially formed first gate electrode. In addition, exemplary embodiments of the present invention include a GOLDD type TFT structure. The GOLDD type TFT can be formed in a driving circuit area and a pixel area. In the alternative, it is also possible to arrange the GOLDD type TFT in the driving circuit area and arrange a LDD-type TFT or a p-type TFT in the pixels of the pixel area.

Figure 2A:
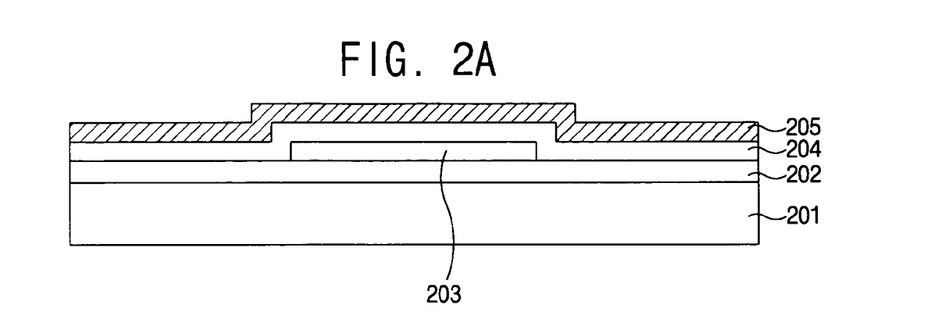
FIGS. 2A to 2G illustrate fabrication processes of a GOLDD type liquid crystal display device in accordance with an embodiment of the present invention using etching.

FIGS. 2A to 2G illustrate a fabricating process of a GOLDD type TFT for a liquid crystal display device in accordance with an embodiment of the present invention using etching. As shown in FIG. 2A, a buffer layer 202 is formed by depositing an insulating substance, such as SiOx, onto a substrate 201 made of a transparent substance, such as glass, by a PECVD (plasma enhanced chemical vapor deposition) method, for example. A polycrystalline semiconductor layer 203 is formed on the buffer layer 202 by forming amorphous semiconductor, such as amorphous silicon, on the buffer layer 202, crystallizing the amorphous semiconductor and then etching the amorphous semiconductor.

Crystallization can be performed by a high temperature crystallization method or a low temperature crystallization method. The high temperature crystallization method induces crystallization by heating an amorphous semiconductor layer in a high-temperature furnace. The low temperature crystallization method crystallizes an amorphous semiconductor layer by irradiating a high-energy laser onto the amorphous semiconductor layer. Because glass deforms at temperatures above 600° C., the high temperature crystallization method is not appropriate for a fabrication process of a liquid crystal display device using a substrate made of glass. Therefore, the low temperature crystallization method performed below temperatures of 600° C. can be efficiently used in the present invention.

To further appreciate the present invention, the crystallizing process of an amorphous semiconductor material to form polycrystalline semiconductor will be briefly described. When the amorphous semiconductor layer is fused, atoms of the fused amorphous semiconductor material are rearranged around a certain core generated during the cooling process of the fused amorphous semiconductor material so as to form a plurality of unit crystals. The unit crystals have boundaries with one another so as to form polycrystalline. A boundary surface of a unit crystal is called a grain boundary, which is a border having atoms arranged in different directions with respect to each other. The grain boundary is a factor in determining the field effect mobility of a polycrystalline semiconductor material.

When electrons pass through a polycrystalline silicon material, the less grain boundaries there are, the faster electrons will pass through the polycrystalline silicon material. In general, field effect mobility in an amorphous silicon is about 0.1~0.2 $cm^2/Vsec$, field effect mobility of the polycrystalline silicon fabricated by a general heat processing method is about 10~20 $cm^2/Vsec$. In contrast, the field effect mobility of polycrystalline silicon fabricated by an excimer laser is not less than approximately 100 $cm^2/Vsec$. Because of those characteristics, polycrystalline semiconductor is typically used in the exemplary embodiments of the present invention.

Further, sequential lateral solidification can be used to form the polycrystalline semiconductor material in exemplary embodiments of the present invention. The size of a grain grown in the lateral direction is increased due to crystallization progressing in a lateral direction. Accordingly, when a TFT is formed, the grain boundary of the polycrystalline silicon layer in which the channel region is formed can be minimized. Accordingly it is possible to operate the TFT at higher speeds.

As described-above, the crystallized polycrystalline silicon is patterned through a photolithography process to form a polycrystalline semiconductor layer 203 having a certain pattern. A gate insulating layer 204, such as SiNx or SiOx, is formed over the substrate 201 on which the semiconductor layer 203 is formed. A first metal layer 205 is formed on the gate insulating layer 204 by a sputtering method or an evaporation method, for example.

Figure 2B:
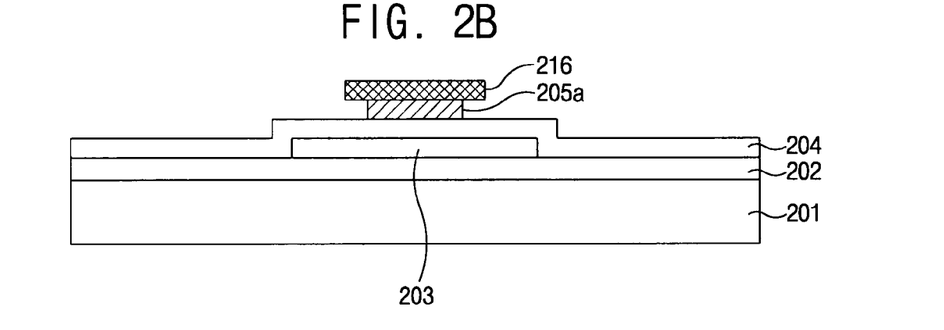

As shown in FIG. 2B, a photoresist is deposited onto the first metal layer 205 and developed using a mask to form a first photoresist pattern 216. Afterward, the first metal layer 205 is etched using the first photoresist pattern 216 to form a first gate electrode 205a. Then, the first metal layer 205 is over-etched with a wet etched having isotropic etching characteristics. Thus, the first gate electrode 205a has a narrower width than that of the photoresist pattern 216, as shown in FIG. 2B.

Figure 2C:
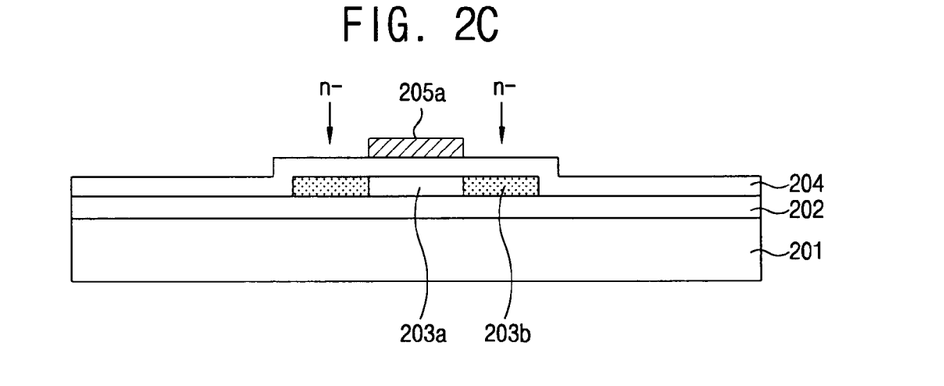

As shown in FIG. 2C, the first gate electrode blocks 205a part of the semiconductor layer 203 after the first photoresist pattern 216 is removed. A low-density impurity, such as n-type ions, is then injected into regions of the semiconductor layer that are not blocked by the by the first gate electrode 205a to form low-density impurity regions 203b. As depicted in FIG. 2C, the channel region 203a is formed between the low-density impurity regions 203b and directly under the first gate electrode 205a.

Figure 2D:
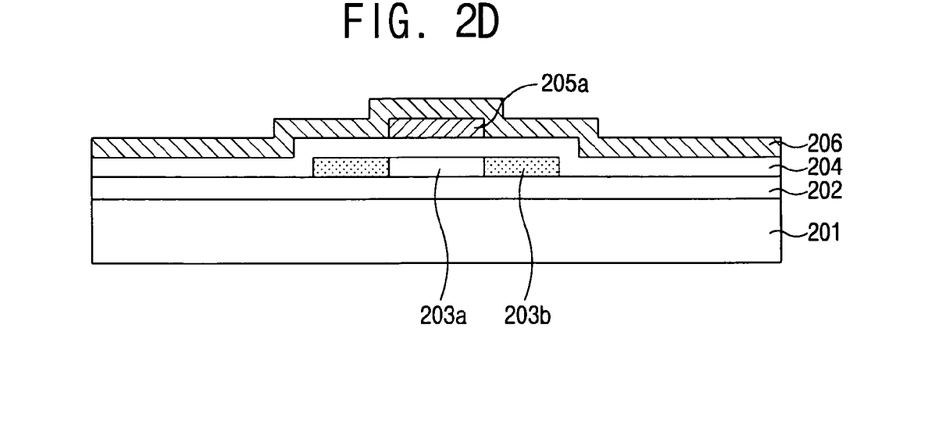
Figure 2E:
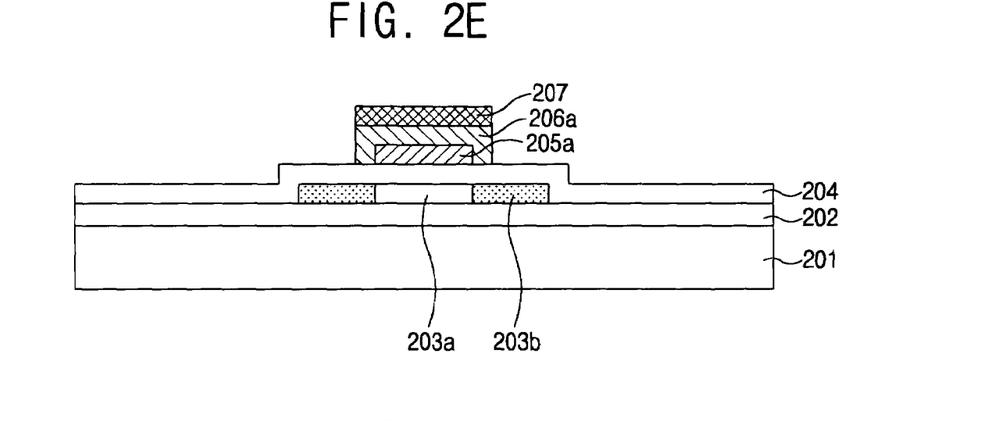

Subsequently, as shown in FIG. 2D, a second metal layer 206 is formed on the gate insulating layer 204 and on the first gate electrode 205a by a sputtering method or an evaporation method, for example. A photoresist is then deposited onto the second metal layer 206 and is developed. Accordingly a second photoresist pattern 207 is formed as depicted in FIG. 2E. The mask used in developing the second photoresist pattern 207 is the same mask used in forming the first photoresist pattern 216 to etch the first gate electrode 205a. Thus, the width of the second photoresist 207 is the same as the first photoresist 216.

The second metal layer 206 is etched using the second photoresist pattern 207 to form the second gate electrode 206a. Unlike the first metal layer 205 that was over-etched by an isotropic etching method, the second metal layer 206 is etched by an anisotropic etching method. Thus, all of the second metal layer 206 directly under the second photoresist patter 207 remains. Thus, the width of the second gate electrode 206a is greater than that of the first gate electrode 205a. Further, the second gate electrode 206a covers the first gate electrode 205a completely and is directly over portions of the low-density impurity regions 203b.

Figure 2F:
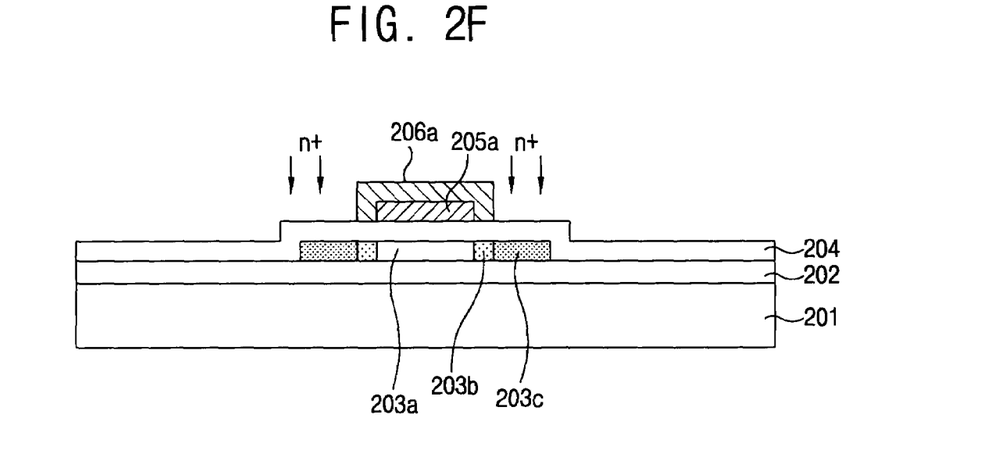

As described-above, by forming the second gate electrode 206a, portions of the low-density impurity regions 203b at both sides of the channel region 203a are blocked by the second gate electrode 206a. After stripping the second photoresist pattern 207, a high-density impurity ion, such as n+ ions, are injected into the of the low-density impurity regions 203b that are not blocked by the second gate electrode to form high-density impurity regions 203c, such as n+ regions, as shown in FIG. 2F. Low-density regions 203b covered by the second gate electrode 206a are still low-density regions, such as n− regions. Thus, a width of one of the low-density regions 203b can be the same as the thickness of the second gate electrode 206a on a side of the first gate electrode 205a. Accordingly, the GOLDD structure consisting of the channel region 203a, the low-density regions 203b and high-density regions 203c is formed.

Figure 2G:
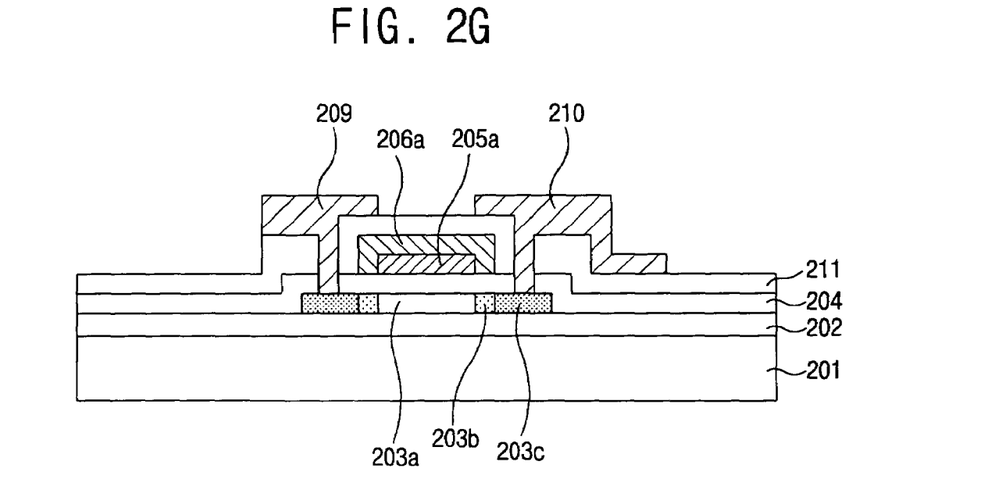

As shown in FIG. 2G, an insulating layer 211 is deposited over the whole substrate 201 and the second gate electrode 206a. Contact holes are then formed in the insulating layer 211 to the high-density impurity regions 203c. Subsequently, a source electrode 209 and a drain electrode 210 are formed on the insulating layer 211 that respectively contact the high-density regions to complete the GOLDD TFT.

As described-above, the present embodiment comprises two gate electrodes that each has a different width that are both formed using the same mask. The first gate electrode and the second gate electrode can be made of the same metal. In the alternative, the first and second gate electrode can be made of different materials or the same materials. For example, the first gate electrode 205a and the second gate electrode 205b can be made of metals, such as Cu, Mo, Ta, Cr, Ti, Al, polysilicon or alloys thereof.

Although the first and second photoresist patterns 216 and 207 having the same width are formed using the same mask, the two gate electrodes 205a and 206a having different widths are formed by differentiating an etching degree of the metal layers 205 and 206 by using different etching methods (namely, isotropic etching and anisotropic etching). In the alternative, other methods can be used to form the two gate electrodes 205a and 206a having different widths using one mask. In general, the photoresist is stripped by an ashing process. That process can be used particularly in stripping the photoresist after patterning the metal layer.

Figure 3A:
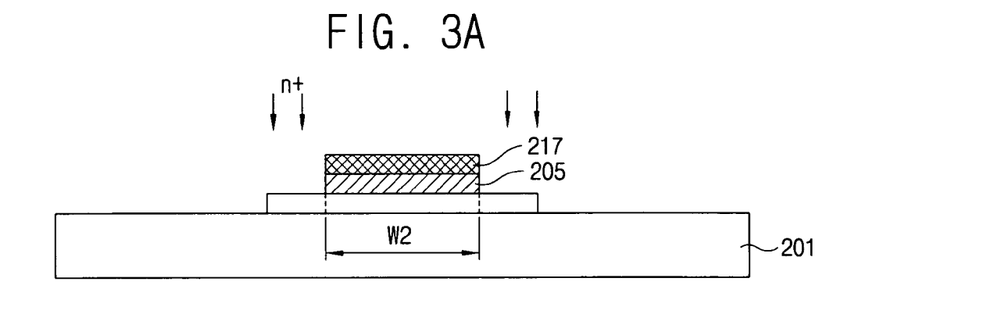
FIGS. 3A to 3E illustrate fabrication processes of a GOLDD type liquid crystal display device in accordance with an embodiment of the present invention using ashing.
Figure 3B:
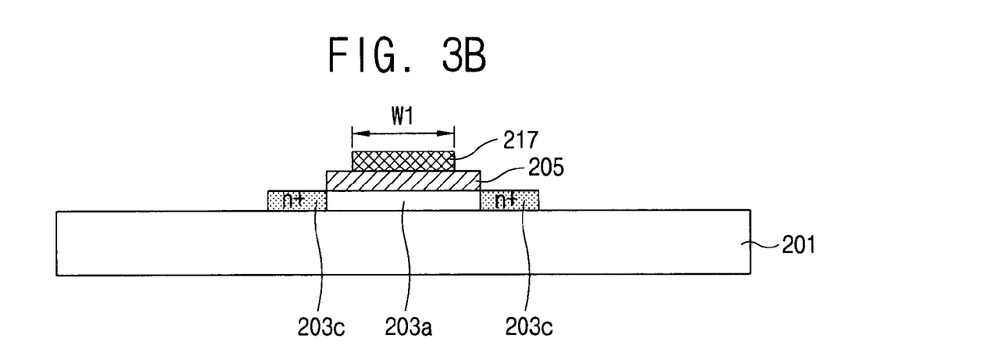
Figure 3C:
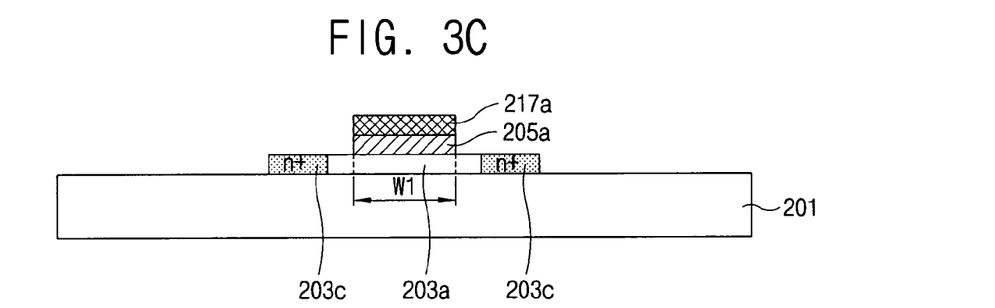
Figure 3D:
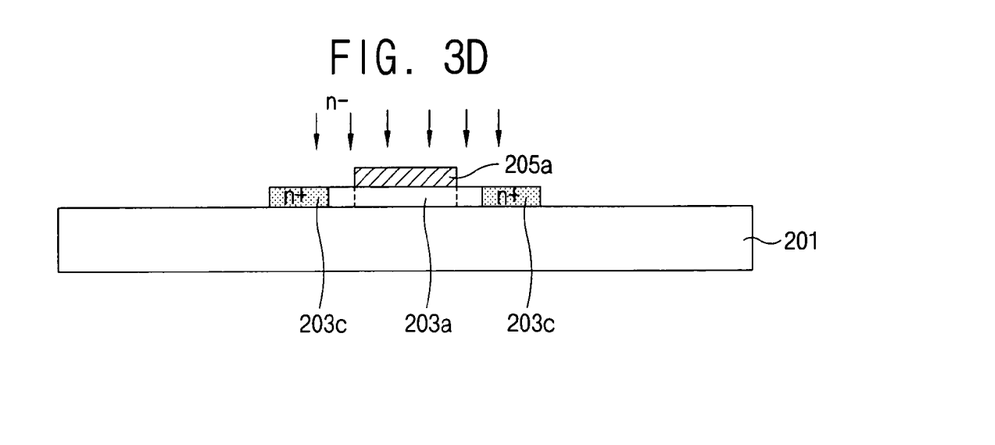
Figure 3E:
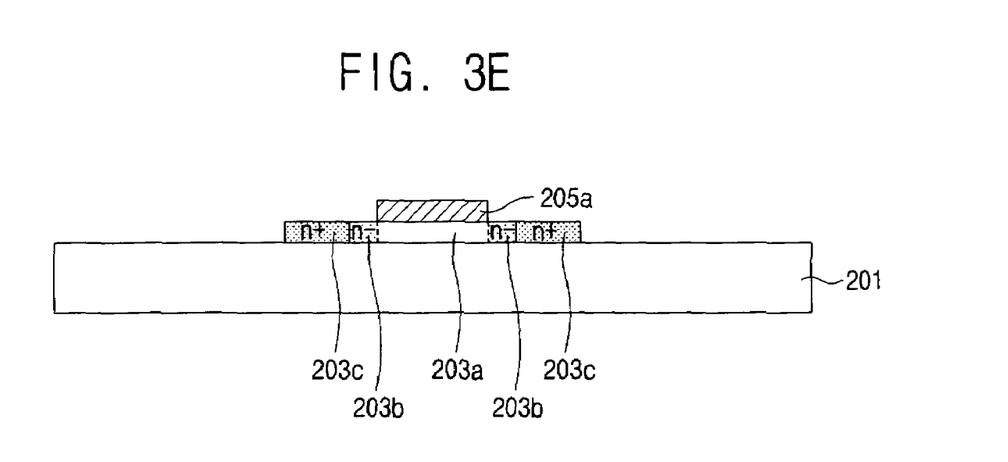

FIGS. 3A to 3E illustrate fabrication processes of a GOLDD type liquid crystal display device in accordance with an embodiment of the present invention using ashing. By using the ashing process, the two gate electrodes 205a and 206 having the different widths can be formed using only one mask. As shown in FIG. 3A, a photoresist 217 is patterned to a certain width W2 (namely, the width corresponding to the mask) to form the second gate electrode 206a. The photoresist 217 is used to form high-density impurity regions 203c at both sides of the channel region 203a. As shown in FIG. 3B, the photoresist 217 is ashed such that a photoresist pattern 217a having a predetermined width W1 remains on the first metal layer 205. As shown in FIG. 3C, the first gate electrode 205a is formed by the anisotropy etching using the first photoresist pattern 217a. As shown in FIGS. 3D and 3E, the first gate electrode 205a is used to form low-density impurity regions 203b at both sides of the channel region 203a. Ashing conditions of the photoresist can be varied according to a width of the first gate electrode 205a to be formed. As described above, in the case of forming the gate electrodes 205a and 206a having different widths by ashing of the photoresist, fabrication processes can be simplified and the width of the first gate electrode 205a can be easily controlled because the etching process is performed using the same etching solution (namely, the same kind and the same density) and the same etching conditions (etching time and environment, etc.).

In another method, the first gate electrode 205a and the second gate electrode 206a, the metal layers 205 and 206 can be formed by a photolithography process including evaporation and the sputtering. The gate electrodes 205a and 206a in accordance with the present invention can also be formed by other methods. The second gate electrode 206a of the present inventions can, in another alternative, be formed directly on and in contact with the first gate electrode 205a.

Figure 4A:
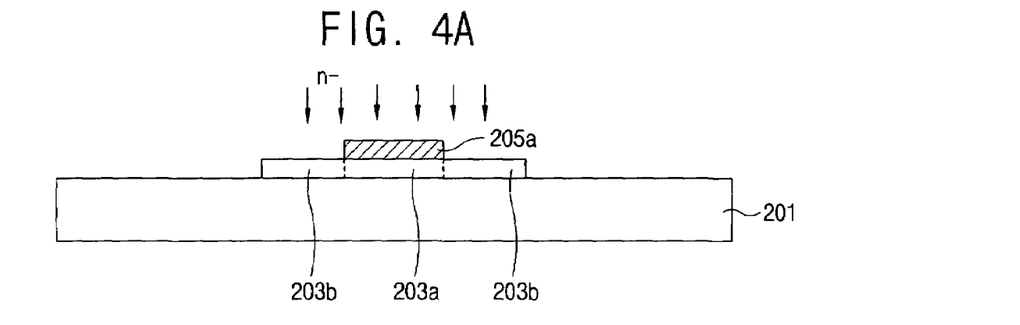
FIGS. 4A to 4D illustrate fabrication processes of a GOLDD type liquid crystal display device in accordance with an embodiment of the present invention using electroplating.
Figure 4B:
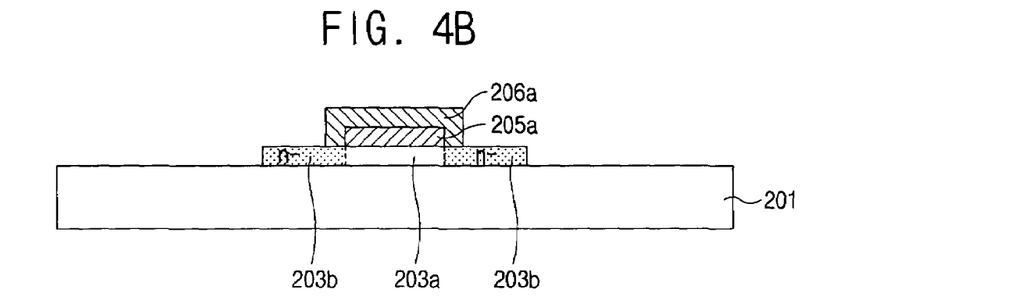
Figure 4C:
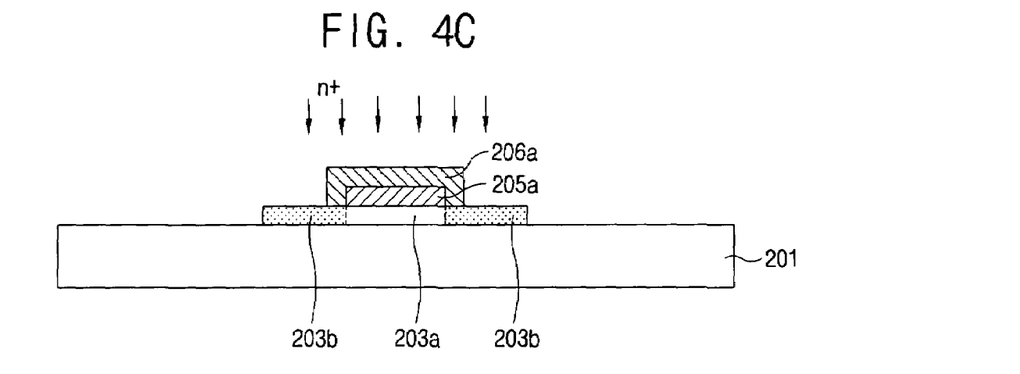
Figure 4D:
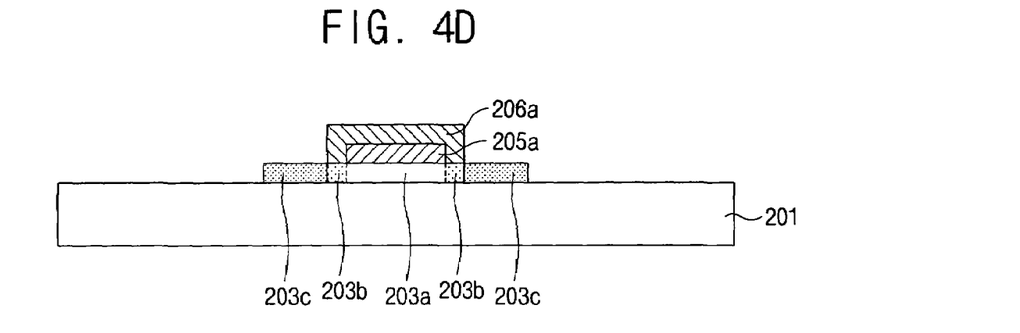

FIGS. 4A to 4D illustrate fabrication processes of a GOLDD type liquid crystal display device in accordance with an embodiment of the present invention using electroplating. As shown in FIG. 4A, the first gate 205a is used to form low-density impurity regions 203b at both sides of the channel region 203a. As shown in FIG. 4B, the second gate electrode 206a is formed by an electroplating method using the first gate electrode 205a as one electrode. More particularly, the first gate electrode 205a and an opposed electrode (the anode) is put into an electrolyte having metal ions while a voltage is applied. The metal ions in the electrolyte attached to and build up upon electrons of the first gate electrode 205a. Accordingly, the second gate electrode 205a having a certain width can be formed on the first gate electrode 205a. Then, As shown in FIGS. 4D and 4E, the second gate electrode 206a is used to form high-density impurity regions 203c.

Certain advantages can be obtained by forming the second gate electrode 206a using an electroplating method. First, the fabrication process can be simplified. The electroplating process consists of placing the substrate having the first gate electrode 205a into an electrolyte and applying a voltage. Such an electroplating process is much simpler than a photolithography process, which includes: photoresist deposition, developing and hardening followed by metal layer etching and photoresist stripping. Second, fabrication costs can be reduced because the photoresist solution, photo etching solution and expensive vacuum chamber of the photolithographic process are not required in an electroplating method. Third, a TFT having good characteristics can be obtained. When the second gate electrode 206a is formed by the photolithography process, the first gate electrode 205a and the second gate electrode 205b are formed by using the same mask; however two photolithography processes are required. Although the second gate electrode 206a is formed at an expected position by arranging the mask by using a marker, error may occur in forming the second gate electrode 206a, because actually there is a limit to arranging the mask by using the marker. When the error occurs, it may cause errors in alignment of the LDD regions 203b formed in the semiconductor layer 203 such that electrical characteristics of the TFT will be degraded. In contrast, in the use of electroplating, because the second gate electrode 206a is formed by combining metal ions with the first gate electrode 205a, self-aligning can be performed. Accordingly, the second gate electrode 206a can be formed at an expected position, and the LDD regions 203b having set widths can be formed.

As described above, in the present invention, a fabricating cost of the TFT having the GOLDD type can be reduced by forming the gate electrode in two layers. The TFT having the GOLDD structure is mainly used for a liquid crystal display device. A liquid crystal display device using the TFT having the GOLDD structure will now be described in detail.

Figure 5:
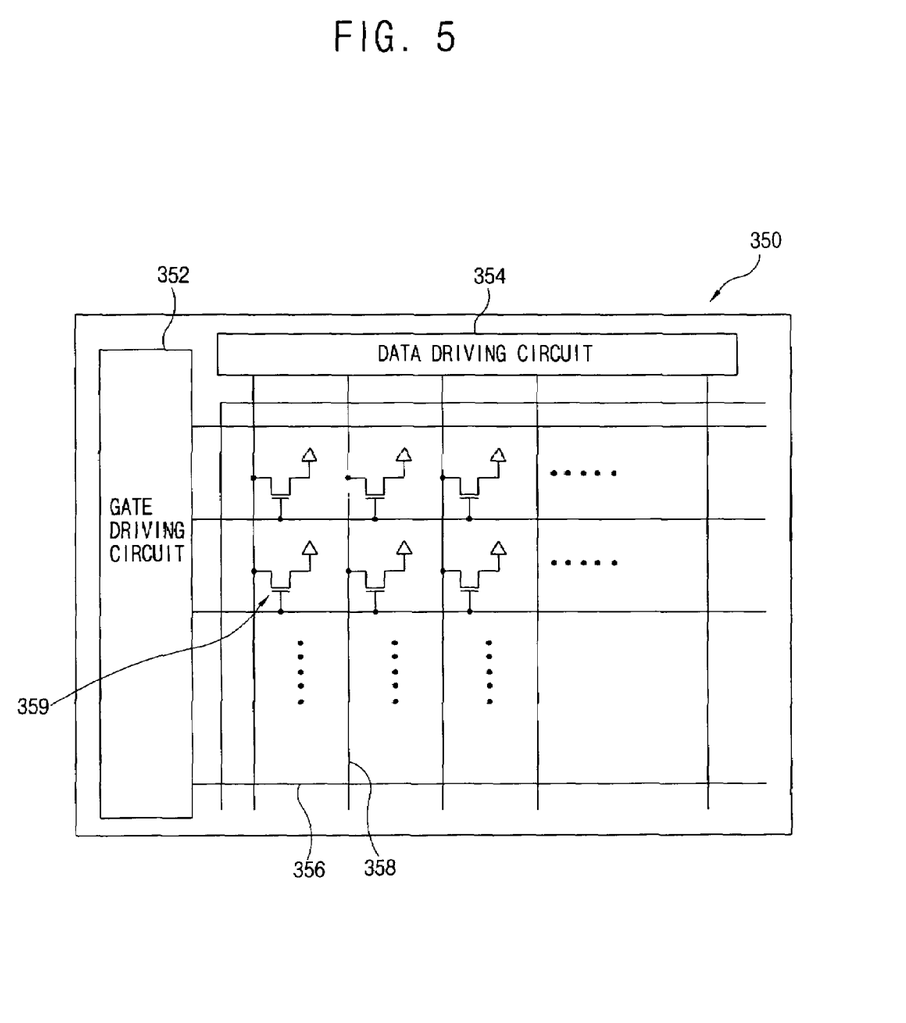
FIG. 5 is a plane view illustrating a structure of a liquid crystal display device.

As shown in FIG. 5, the liquid crystal display device includes a pixel area having a plurality of pixels for realizing an actual image; and a driving circuit area formed at the periphery of the pixel area to supply signals to the pixels of the pixel area. A plurality of gate lines 356 and a plurality of data lines 358 are arranged in columns and rows to define pixels in the pixel area. A TFT 359 is formed in each of the pixels in the pixel area.

The driving circuit area includes a gate driving circuit 352 for applying a scan signal to the gate line 356 and a data driving circuit 354 for applying a data signal to the data line 358. In the related art, the gate driving circuit 352 and the data driving circuit 354 of the driving circuit area are fabricated as ICs (integrated circuits) and are mounted on a TCP (tape carrier package). However, the gate driving circuit 352 and the data driving circuit 354 of the driving circuit area can be mounted directly on the glass substrate in order to minimize an unnecessary region (namely, a region where an image is not displayed) of the liquid crystal display device. Furthermore, a liquid crystal display device capable of reducing unnecessary region and simplifying fabrication processes by simultaneously forming a polycrystalline transistor having high field effect mobility with the TFT formed in the pixel can be produced.

It is possible to form the TFT having the GOLDD structure of the exemplary embodiments in the present invention in the pixel area as a polycrystalline TFT. It is also possible to form the TFT having the GOLDD structure in the driving circuit area such that a liquid crystal display device having a system on panel can be fabricated. Hereinafter, the liquid crystal display device using the GOLDD structure will be described.

Figure 6:
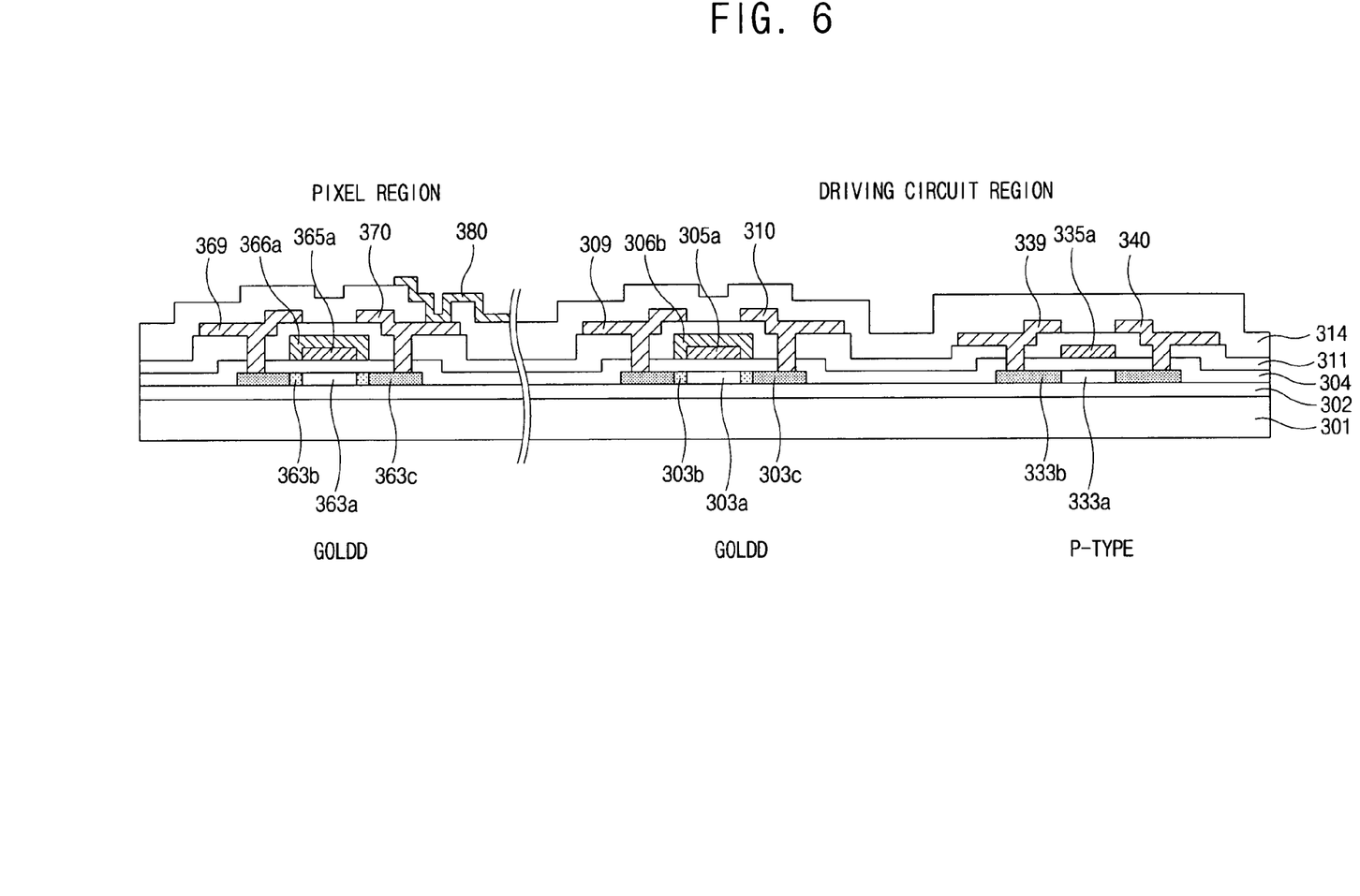
FIG. 6 illustrates a structure of a liquid crystal display device in accordance with an embodiment of the present invention.

FIG. 6 illustrates a liquid crystal display device in which a GOLDD type TFT is formed in the pixel area and in the driving circuit area. As shown in FIG. 6, in the driving circuit area, a CMOS (complementary metal oxide semiconductor) TFT consisting of an n-type GOLDD type TFT and a P-type TFT is formed. In the pixel area, a GOLDD type TFT is formed. In other words, a GOLDD type TFT is formed in the pixels of the pixel area and as a part of the circuits in the driving circuit area.

As shown in FIG. 6, the GOLDD type TFTs formed in the driving circuit area and in the pixel area has the same structure as the GOLDD type TFT shown in FIG. 2G, and is formed using the same fabrication processes. In more detail, the gate electrodes of FIG. 6 each consist of a first gate electrode 305a and 365a and second gate electrode 306a and 366a fabricated by using the same mask so that the first and second gate electrodes have a different width from each other. The second gate electrode 306a and 366a overlaps the low-density regions 303b and 363b or the LDD regions of the GOLDD type TFTs. The LDD regions 303b and 363b are formed by injecting low-density impurities while using the first gate electrode 305a and 365a as a mask. High-density impurity regions 303c and 363c are formed by injecting high impurities using the second gate electrode 306a and 366a as a mask.

In the driving circuit area, a p-type TFT is formed. The gate electrode of the p-type TFT is fabricated during the fabricating process of the GOLDD type TFT. More specifically, the gate electrode 335a of the P-type TFT is formed when the first gate electrode 305a/365a or the second gate electrode 306a, 366a of the GOLDD type TFT is formed. Then, p-type impurity regions 333b are formed by injecting p-type impurities using the gate electrode 335a as a mask.

As shown in FIG. 6, an n-type GOLDD TFT is also formed in the driving circuit area together with the p-type TFT such that a CMOS circuit formed. Instead of an n-type GOLDD TFT formed in a pixel, the TFT in the pixel can be p-type TFT. However, it is more preferable to form TFT in the pixels as an n-type. In another alternative, the CMOS of the driving circuit area can be formed as a p-type GOLDD type TFT and a n-type transistor.

In the pixel area and in the driving circuit area, a passivation layer 314 is formed over the whole substrate 301. A pixel electrode 380 made of a transparent substance, such as ITO (indium tin oxide), is formed on the passivation layer 314. The pixel electrode is in contact with the drain electrode 370 through a contact hole in the passivation layer 314. In addition, although not shown in drawings, the substrate 301 is attached to another substrate on which a color filter layer having R (red), G (green) and B (blue). A liquid crystal layer is then positioned between the two substrates such that a liquid crystal display device is fabricated.

By using the GOLDD type TFT in accordance with exemplary embodiments of the present invention for a liquid crystal display device as described above, the following advantages can be obtained. First, fabrication costs are reduced and fabrication processes are simplified because only one mask is used to form the two gate electrodes. Second, a liquid crystal display device having improved operational speed can be obtained because the GOLDD type TFT has greater field effect mobility in comparison to a general LDD-structured TFT. Third, a liquid crystal display device having a minimized area can be fabricated because a GOLDD type TFT can have a short channel such that an area of an image non-display region (in which the GOLDD type TFT is arranged) can be minimized while a screen on which an image is displayed is not reduced. Fourth, a liquid crystal display device having an improved aperture ratio can be provided because the GOLDD type TFT can be formed to have a minimum area such that an aperture ratio of a liquid crystal display device in which the GOLDD type TFT is formed in the pixel can be improved. Fifth, a liquid crystal display device having improved reliability can be fabricated because in comparison with a general TFT or an LDD-structured TFT, the GOLDD type TFT can minimize damage of a channel region due to hot carrier such that reliability of the liquid crystal display device can be improved.

Figure 7:
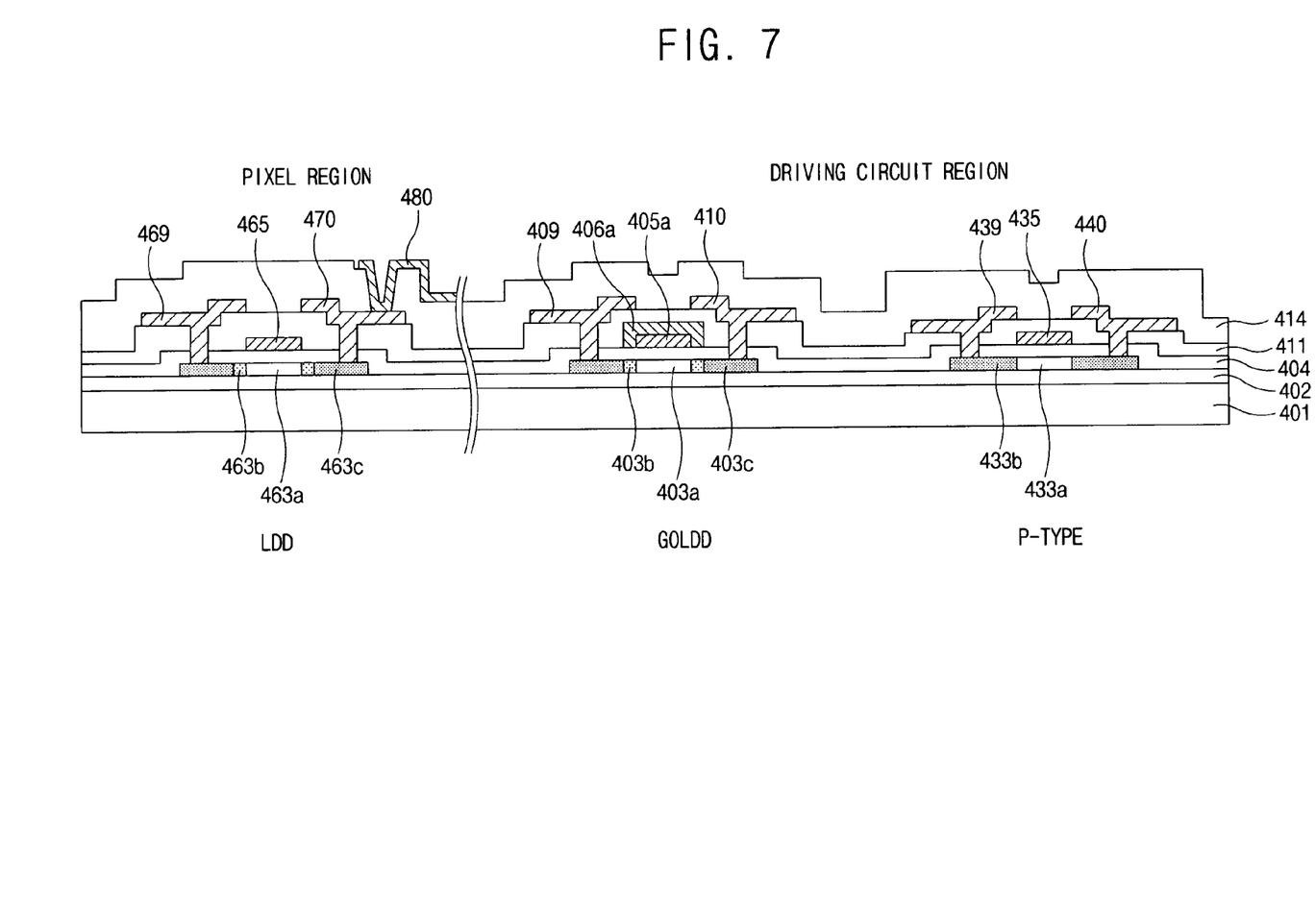
FIG. 7 illustrates a structure of a liquid crystal display device in accordance with another embodiment of the present invention.

In the pixel area, a TFT besides the GOLDD type TFT having another structure can be formed. Even in the case that another TFT is formed in the pixel area, a GOLDD type TFT can still be formed in the driving circuit area. FIG. 7 illustrates a structure of a liquid crystal display device in accordance with another embodiment of the present invention. More particularly, FIG. 7 illustrates a structure of a liquid crystal display device in which an LDD-structured TFT is formed in the pixel area. Herein, some of the same constructions are used that were used in FIG. 6, only different constructions will be subsequently described.

As shown in FIG. 7, in the driving circuit area, a CMOS TFT consisting of an n-type GOLDD type TFT and a p-type TFT is formed. On the other hand, in the pixel area, an LDD-structured TFT is formed. In the GOLDD type TFT, two gate electrodes 405a and 406a are formed, and only the second gate electrode 406a overlaps the LDD regions 403b. On the other hand, in the LDD-structured TFT, only one gate electrode 465 is formed and the gate electrode 465 does not overlap with an LDD regions 463b. In the LDD type TFT, a channel region 463a corresponds to the gate electrode 465, and the LDD regions 463b is formed at both sides of the channel region 463a. The gate electrode 465 of the LDD-structured TFT can be formed during the forming of the first gate electrode 405a or during the forming of the second gate electrode 406a of the GOLDD type TFT.

Figure 8:
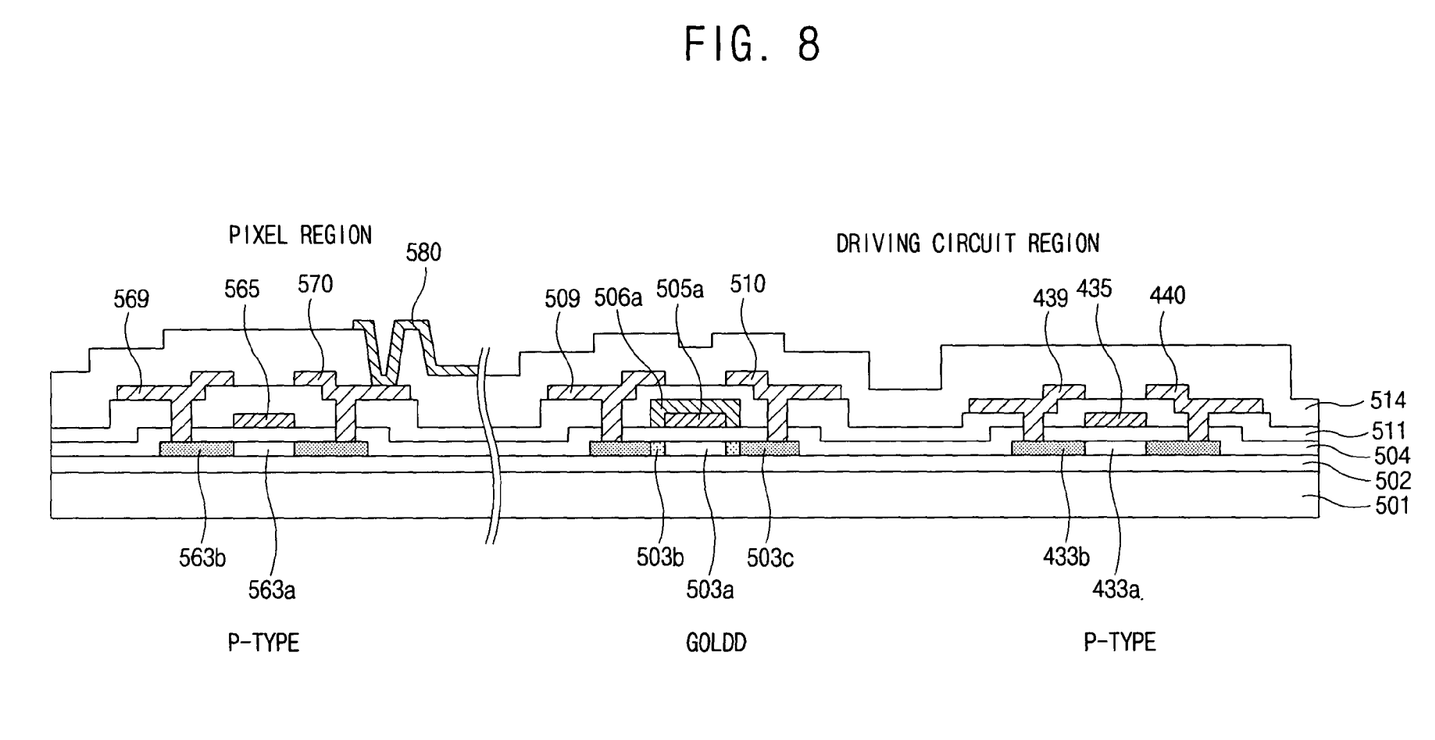
FIG. 8 illustrates a structure of a liquid crystal display device in accordance with yet another embodiment of the present invention.

FIG. 8 illustrates a structure of a liquid crystal display device in accordance with yet another embodiment of the present invention. More specifically, FIG. 8 illustrates a liquid crystal display device in which a p-type TFT is formed in the pixel area. Further, FIG. 8 shows a CMOS TFT consisting of an n-type GOLDD type TFT and a p-type TFT formed in the driving circuit area. On the other hand, a p-type TFT is formed in the pixel area. Accordingly, there are no LDD regions formed in the TFT of the pixel area. Herein, the p-type TFT of the pixel area is formed by the same process as that of the p-type TFT of the driving circuit area. In that case, a gate electrode 565 of the p-type TFT of the pixel area is formed while forming a first gate electrode 505a or a second gate electrode 506a of the GOLDD type TFT. The TFT formed in the pixel area can be formed as an n-type TFT instead of a p-type TFT. However, since the off current of the p-type TFT is smaller than that of the n-type TFT, it is more preferable to use the p-type TFT.

As described-above, in the present invention, by using the GOLDD type TFT for a liquid crystal display device, it is possible to fabricate a liquid crystal display device having rapid operational speed and improved reliability. In addition, by injecting a low-density impurity and high-density impurity while forming a gate electrode with only one mask, a liquid crystal display device capable of simplifying fabrication processes and reducing a fabrication cost can be provided.

What is claimed is:

1. A thin film transistor, comprising:
    a substrate;
    a crystallized semiconductor layer formed over the substrate having a channel region, low-density impurity regions and high-density impurity regions;
    a gate insulating layer formed on the crystallized semiconductor layer;
    a first gate electrode formed on the gate insulating layer having a width corresponding to the channel region;
    a second gate electrode formed on the first gate electrode and on the gate insulating layer such that the second gate electrode overlaps the low-density impurity regions, the second gate electrode having a first portion disposed on an uppermost surface of the first gate electrode and extending substantially parallel to the substrate and second portions having substantially uniform thickness disposed along opposing sidewalls of the first gate electrode and extending substantially perpendicular to the substrate; and
    a source electrode and a drain electrode respectively contacting the high-density impurity regions,
    wherein a thickness of the second portions of the second gate electrode are substantially equal to a width of the low-density impurity regions and terminal ends of the second portions of the second gate electrode directly contact the gate insulating layer and are substantially parallel to the substrate.

2. The thin film transistor of claim 1, wherein the crystallized semiconductor layer is a polycrystalline silicon layer.

3. The thin film transistor of claim 1, wherein the low-density impurity regions are n⁻ regions.

4. The thin film transistor of claim 1, wherein the high-density impurity regions are n⁺ regions.

5. The thin film transistor of claim 1, wherein the first gate electrode and the second gate electrode are made of the same materials.

6. The thin film transistor of claim 1, further comprising a buffer layer formed on the substrate.

7. The thin film transistor of claim 1, further comprising an insulating layer formed over the second gate electrode, wherein the source electrode and the drain electrode are contacted to the high-density impurity regions though respective contact holes in the insulating layer.

8. The thin film transistor of claim 1, wherein the second gate electrode layer has a substantially uniform width greater than a width of the first gate electrode layer.

9. The thin film transistor of claim 1, wherein the channel region has a width corresponding to the width of the first gate electrode layer.

10. A liquid crystal display device, comprising:
    a first substrate and a second substrate;
    a plurality of gate lines and data lines formed over the first substrate so as to define a plurality of pixels;
    thin film transistors arranged in the plurality of pixels that each include a polycrystalline semiconductor layer including a channel region between low-density impurity regions that are in between high-density impurity regions, a gate insulating layer formed on the polycrystalline semiconductor layer, a first gate electrode formed on the gate insulating layer corresponding to the channel region, a second gate electrode formed on the first gate electrode and on the gate insulating layer such that the second gate electrode overlaps the low-density impurity regions, and a source electrode and a drain electrode contacted to the high-density impurity regions;

a pixel electrode formed in the pixel area;

a color filter layer formed on the second substrate; and a liquid crystal layer formed between the first substrate and the second substrate, wherein the second gate electrode has a first portion disposed on an uppermost surface of the first gate electrode and extending substantially parallel to the substrate and second portions having uniform thickness disposed along opposing sidewalls of the first gate electrode and extending substantially perpendicular to the substrate, and wherein a thickness of the second portions of the second gate electrode are substantially equal to a width of the low-density impurity regions and terminal ends of the second portions of the second gate electrode directly contact the gate insulating layer and are substantially parallel to the substrate.

11. The liquid crystal display device of claim 10, wherein the first gate electrode and the second gate electrode are made of different materials.

12. A liquid crystal display device, comprising:

a first substrate including a pixel area and a driving circuit area;

a first thin film transistor formed in the pixel area;

a second thin film transistor formed in the driving circuit area, the second thin film transistor including first and second layers of gate electrodes, a semiconductor layer having a low-density impurity regions overlapped with only one of the gate electrode layers, a source electrode and a drain electrode; and a third thin film transistor formed in the driving circuit area, wherein the first layer of the gate electrodes corresponds to an area between the low-density impurity regions and the second layer is disposed on the first layer and includes a first portion disposed on an uppermost surface of the first layer and extending substantially parallel to the substrate and second portions having substantially uniform thickness disposed along opposing sidewalls of the first layer and extending substantially perpendicular to the substrate, and wherein a thickness of the second portions of the second layer are substantially equal to a width of the low-density impurity regions and terminal ends of the second portions of the second layer directly contact the gate insulating layer and are substantially parallel to the substrate.

13. The liquid crystal display device of claim 12, wherein the low-density impurity regions are n⁻ regions.

14. The liquid crystal display device of claim 12, wherein the third thin film transistor is a p-type thin film transistor.

15. The liquid crystal display device of claim 12, wherein the first thin film transistor is a gate overlapped lightly doped drain thin film transistor.

16. The liquid crystal display device of claim 15, wherein the first thin film transistor includes:

two layers of gate electrodes formed over the substrate;

a polycrystalline semiconductor layer arranged under the gate electrodes such that at least a part of lightly doped drain regions is overlapped by only one layer of the gate electrodes; and a source electrode and a drain electrode.

17. The liquid crystal display device of claim 12, wherein the first thin film transistor is a lightly doped drain thin film transistor.

18. The liquid crystal display device of claim 17, wherein the first thin film transistor includes:

a polycrystalline semiconductor layer having a channel region between low-density impurity regions that are disposed between high-density impurity regions;

a gate electrode arranged over the channel region; and a source electrode and a drain electrode.

19. The liquid crystal display device of claim 12, wherein the first thin film transistor is a p-type thin film transistor.

20. The liquid crystal display device of claim 12, further comprising:

a second substrate on which a color filter layer is formed; and a liquid crystal layer formed between the first substrate and the second substrate.

21. The thin film transistor of claim 12, wherein the first and second layers of the two layers of gate electrodes are made of different materials.

* * * * *